(12) United States Patent
Rodríguez et al.

(10) Patent No.: US 11,264,060 B2
(45) Date of Patent: Mar. 1, 2022

(54) VOLTAGE REGULATION SYSTEM FOR MEMORY BIT CELLS

(71) Applicant: Advanced Micro Devices, Inc., Santa Clara, CA (US)

(72) Inventors: Miguel Rodríguez, Ft. Collins, CO (US); Stephen Victor Kosonocky, Ft. Collins, CO (US); Casey Lee Hardy, Boulder, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/926,974

(22) Filed: Jul. 13, 2020

(65) Prior Publication Data

US 2020/0411067 A1  Dec. 31, 2020

Related U.S. Application Data

(63) Continuation of application No. 16/425,579, filed on May 29, 2019, now Pat. No. 10,714,152.

(51) Int. Cl.
*G11C 5/14* (2006.01)

(52) U.S. Cl.
CPC .................. *G11C 5/147* (2013.01)

(58) Field of Classification Search
CPC ... H02M 3/07–077; G11C 5/145; G11C 5/147
See application file for complete search history.

(56) References Cited

U.S. PATENT DOCUMENTS

| | | | | |
|---|---|---|---|---|
| 5,119,043 A | * | 6/1992 | Borwn | H03L 7/0805 331/16 |
| 5,568,083 A | * | 10/1996 | Uchiyama | G05F 1/465 327/538 |
| 6,005,819 A | | 12/1999 | Shin | |
| 6,504,422 B1 | * | 1/2003 | Rader | H02M 3/07 327/536 |

(Continued)

OTHER PUBLICATIONS

International Search Report and Written Opinion in International Application No. PCT/US2020/034712, dated Aug. 18, 2020, 13 pages.

(Continued)

*Primary Examiner* — Adam D Houston
(74) *Attorney, Agent, or Firm* — Kowert Hood Munyon Rankin and Goetzel PC; Rory D. Rankin (57) ABSTRACT

Systems, apparatuses, and methods for dynamically generating a memory bitcell supply voltage rail from a logic supply voltage rail are disclosed. A circuit includes at least one or more comparators, control logic, and power stage circuitry. The circuit receives a logic supply voltage rail and compares the logic supply voltage rail to threshold voltage(s) using the comparator(s). Comparison signal(s) from the comparator(s) are coupled to the control logic. The control logic generates mode control signals based on the comparison signal(s) and based on a programmable dynamic range that is desired for a memory bitcell supply voltage rail. The mode control signals are provided to the power stage circuitry which generates the memory bitcell supply voltage rail from the logic supply voltage rail. A voltage level of the memory bitcell supply voltage rail can be above, below, or the same as the logic supply voltage rail.

20 Claims, 12 Drawing Sheets

(56) References Cited

U.S. PATENT DOCUMENTS

| | | | | |
|---|---|---|---|---|
| 6,781,870 | B1* | 8/2004 | Kushida | G11C 11/412 365/154 |
| 7,990,742 | B2* | 8/2011 | Lesso | H02M 3/07 363/62 |
| 8,013,663 | B2* | 9/2011 | Cho | H05B 45/30 327/536 |
| 8,264,273 | B2* | 9/2012 | MacFarlane | H02M 3/07 327/536 |
| 9,837,965 | B1* | 12/2017 | Wagh | H03F 1/223 |
| 9,887,622 | B2* | 2/2018 | Low | H02M 3/07 |
| 10,651,800 | B2* | 5/2020 | King | H03F 3/187 |
| 10,693,368 | B2* | 6/2020 | Yu | H02M 3/07 |
| 10,714,152 | B1* | 7/2020 | Rodriguez | G11C 5/147 |
| 10,826,489 | B1* | 11/2020 | Stormes | H03K 17/687 |
| 2003/0021162 | A1 | 1/2003 | Morishita et al. | |
| 2005/0219878 | A1* | 10/2005 | Ito | H02M 3/07 363/59 |
| 2006/0279562 | A1* | 12/2006 | Emek | H05B 45/46 345/207 |
| 2007/0060093 | A1* | 3/2007 | Kerth | H04W 52/028 455/296 |
| 2007/0205823 | A1* | 9/2007 | Cho | H05B 45/00 327/536 |
| 2008/0044041 | A1* | 2/2008 | Tucker | H03F 1/025 381/120 |
| 2008/0116979 | A1* | 5/2008 | Lesso | H03F 3/185 330/297 |
| 2008/0137444 | A1 | 6/2008 | Mair et al. | |
| 2008/0297231 | A1* | 12/2008 | Riedel | H02M 3/073 327/536 |
| 2009/0167260 | A1* | 7/2009 | Pauritsch | H02M 3/158 323/233 |
| 2012/0170770 | A1* | 7/2012 | Lesso | H03G 3/30 381/107 |
| 2013/0135953 | A1* | 5/2013 | Hirabayashi | G11C 29/50016 365/201 |
| 2014/0009236 | A1* | 1/2014 | Choi | H03B 5/1228 331/117 FE |
| 2014/0219039 | A1* | 8/2014 | Jung | G11C 7/12 365/189.16 |
| 2015/0054479 | A1* | 2/2015 | Shiwaya | H02M 3/1582 323/271 |
| 2016/0197553 | A1* | 7/2016 | Koli | H02M 3/158 323/271 |
| 2016/0268816 | A1* | 9/2016 | Mao | H02J 7/0068 |
| 2016/0268828 | A1* | 9/2016 | Mao | H02J 7/022 |
| 2017/0133931 | A1* | 5/2017 | Elsayed | H03K 17/04 |
| 2017/0346299 | A1* | 11/2017 | Sridhar | G06F 1/3296 |
| 2018/0019615 | A1* | 1/2018 | Wilson | H02J 7/0069 |
| 2018/0019667 | A1* | 1/2018 | Salem | H02M 3/07 |
| 2018/0048265 | A1* | 2/2018 | Nentwig | H03F 3/217 |
| 2018/0095521 | A1* | 4/2018 | Tadinada | G06F 3/04166 |
| 2018/0145683 | A1* | 5/2018 | Shimizu | H02M 3/156 |
| 2018/0183332 | A1* | 6/2018 | Herzer | H02M 3/1584 |
| 2018/0205315 | A1* | 7/2018 | Giuliano | H02M 3/158 |
| 2018/0248525 | A1* | 8/2018 | Orr | G05F 1/575 |
| 2018/0316268 | A1* | 11/2018 | Liu | G06F 1/26 |
| 2018/0367033 | A1* | 12/2018 | Kotikalapoodi | H02M 1/14 |
| 2018/0375362 | A1* | 12/2018 | Huang | H02J 7/0072 |
| 2019/0072991 | A1 | 3/2019 | Kang et al. | |
| 2019/0074769 | A1* | 3/2019 | Youn | H03F 3/19 |
| 2019/0079573 | A1 | 3/2019 | Hanson et al. | |
| 2019/0181755 | A1* | 6/2019 | Swamy | H02M 3/1582 |
| 2019/0181760 | A1* | 6/2019 | Choi | H02M 1/08 |
| 2019/0273433 | A1* | 9/2019 | Salem | H02M 3/07 |
| 2019/0326806 | A1* | 10/2019 | Gong | H02M 3/33507 |
| 2020/0136506 | A1* | 4/2020 | Yu | H02M 3/156 |
| 2020/0333873 | A1* | 10/2020 | El Sherif | G06F 1/3243 |
| 2021/0074347 | A1* | 3/2021 | Van Ostrand | G11C 11/4094 |
| 2021/0125662 | A1* | 4/2021 | Kuo | G11C 5/144 |
| 2021/0149467 | A1* | 5/2021 | Frederick | G06F 1/266 |

OTHER PUBLICATIONS

Jain et al., "Conductance Modulation Techniques in Switched-Capacitor DC-DC Converter for Maximum-Efficiency Tracking and Ripple Mitigation in 22 nm Tri-Gate CMOS", IEEE Journal of Solid-State Circuits, Aug. 2015, pp. 1809-1819, vol. 50, No. 8.

Zheng et al., "A Systematic USFG Design Approach for Integrated Reconfigurable Switched-Capacitor Power Converters", IEEE Transactions on Circuits and Systems—I: Regular Papers, Nov. 2011, pp. 2790-2800, vol. 58, No. 11.

* cited by examiner

VOLTAGE REGULATION SYSTEM FOR MEMORY BIT CELLS

CROSS REFERENCE TO RELATED APPLICATIONS

This application is a continuation of U.S. patent application Ser. No. 16/425,579, entitled "VOLTAGE REGULATION SYSTEM FOR MEMORY BIT CELLS", filed May 29, 2019, the entirety of which is incorporated herein by reference.

BACKGROUND

Description of the Related Art

Modern semiconductor chips include a variety of circuits and components which have different supply voltage requirements. For example, a semiconductor chip (e.g., system on chip (SoC)) includes many components such as processors and memory bitcell arrays. It is noted that the supply voltage for a processor is referred to herein as a "logic voltage". Current solutions for powering memory bitcells fall into two broad categories. Either the memory bitcell voltage is connected to the logic voltage, or a separate voltage rail is used for the memory. Connecting the logic voltage to the memory bitcell voltage limits the logic maximum and minimum voltages, severely impacting system performance. When a separate voltage rail is used, the separate rail can be externally or internally generated. External generation consumes package and board resources, increasing cost and complexity. Internal generation is typically achieved through linear voltage regulators, which also need a separate supply voltage which is higher than the maximum desired memory bitcell voltage. This complicates package and die layout as well as requiring an extra supply voltage. Also, linear voltage regulators are inefficient if the dropout is high.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF IMPLEMENTATIONS

In the following description, numerous specific details are set forth to provide a thorough understanding of the methods and mechanisms presented herein. However, one having ordinary skill in the art should recognize that the various implementations may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, and methods for dynamically generating a memory bitcell voltage rail from a logic voltage rail are disclosed. In one implementation, a voltage regulation module includes at least one or more comparators, control logic, and power stage circuitry. The module receives an input voltage rail and compares the input voltage rail to one or more threshold voltages using the one or more comparators. Comparison signal(s) from the comparator(s) are coupled to the control logic. The control logic generates mode control signals based on the comparison signals and based on a programmable dynamic range that is desired for an output voltage rail. The mode control signals are provided to the power stage circuitry to set a specific voltage level for the output voltage rail. In one implementation, the output voltage rail is used to supply one or more memory bitcell arrays. The output voltage rail can be above, below, or the same as the input voltage rail. In one implementation, the power stage circuitry includes a plurality of reconfigurable switched-capacitors. In another implementation, the power stage circuitry includes a plurality of reconfigurable inductors.

In general, a higher or lower voltage can be generated for the memory bitcell rail from the logic voltage rail. In various implementations, the voltage regulation module has the ability to dynamically change the conversion ratio between the logic voltage rail and the memory bitcell voltage rail. The changes in the conversion ratio are based on a voltage level of the logic voltage rail and based on the desired target voltage level of the memory bitcell voltage rail. In one implementation, the voltage regulation module switches between a plurality of different modes during operation. The modes change automatically in response to detecting a change in the voltage level of the logic voltage rail. The thresholds for switching between modes are programmable. In various implementations, the voltage regulation module makes changes to the voltage conversion ratio (between the logic voltage and the memory bitcell voltage) based on the programmed thresholds.

In various implementations, the logic voltage rail can change due to power management instructions for the processor or due to changes in the processor's operating mode. In one implementation, the memory bitcell does not have the full dynamic range of the processor. In some cases, the memory bitcell has a smaller dynamic range for working with a varying power supply voltage than the processor. For example, in one implementation, the memory bitcell has a minimum voltage level higher than the logic voltage's minimum voltage level and the memory bitcell has a maximum voltage level which is lower than the logic voltage's maximum voltage level. Thus, it can be challenging to draw the supply voltage for the memory bitcell rail from the logic voltage rail. Accordingly, in one implementation, the voltage regulation module translates the logic voltage from a relatively large dynamic range to a relatively small dynamic range for supplying the memory bitcell.

Figure 1:
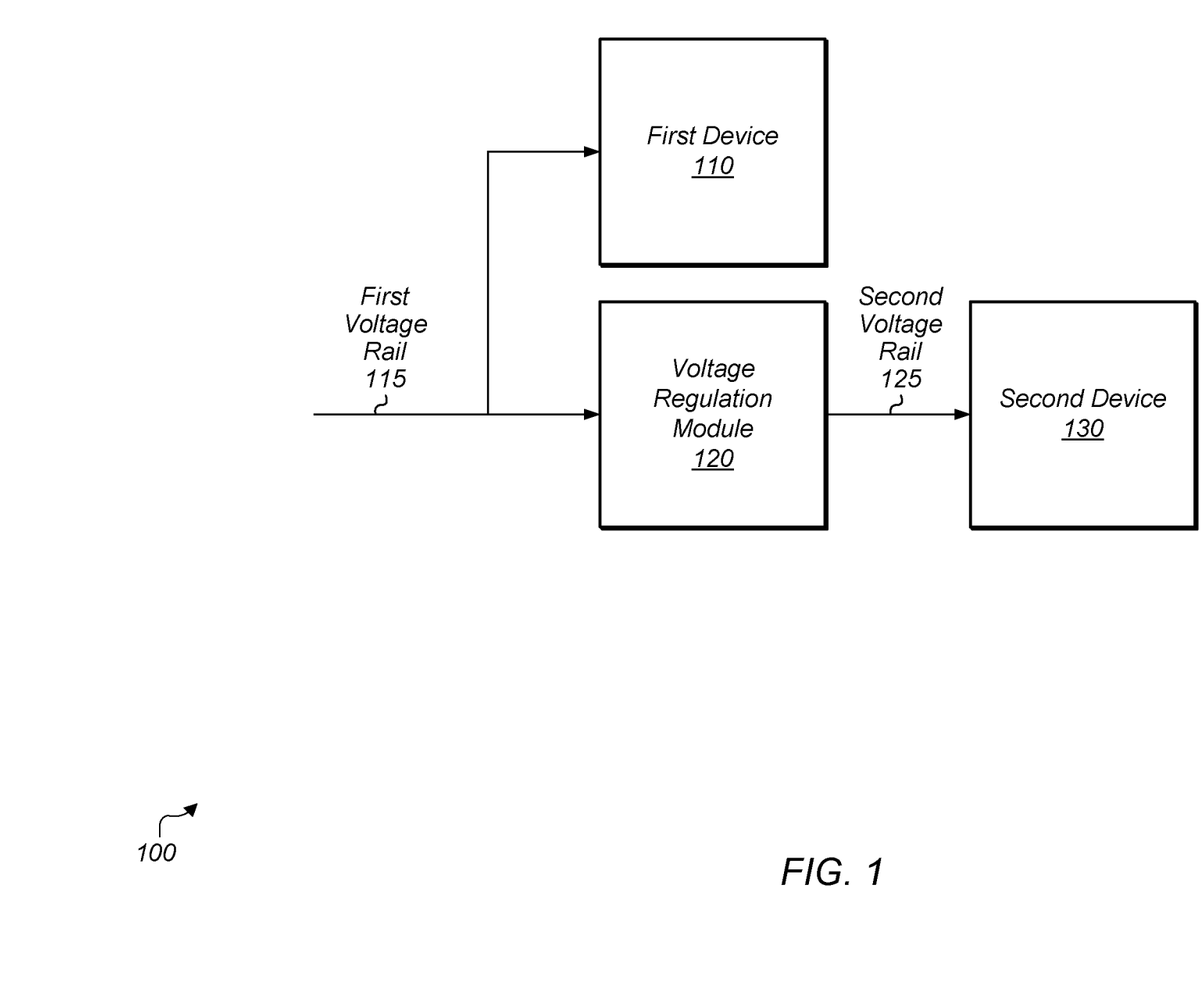
FIG. 1 is a block diagram of one implementation of generic computing system.

Referring now to FIG. 1, a block diagram of one implementation of a generic computing system 100 is shown. In one implementation, computing system 100 includes at least first device 110, voltage regulation module 120, and second device 130. It is noted that computing system 100 can include any number of other devices which are not shown to avoid obscuring the figure. In one implementation, first device 110 is supplied by a first voltage rail 115 and second device 130 is supplied by a second voltage rail 125. Voltage regulation module 120 generates second voltage rail 125 from first voltage rail 115, where second voltage rail 125 can have a voltage which is greater than, less than, or the same as first voltage rail 115.

In one implementation, first device 110 is a processor and second device 130 is a memory device (e.g., one or more memory bitcell arrays). In this implementation, a memory bitcell voltage (Vddm) is generated from the logic voltage (Vdd), with Vddm set points that can be above, below, or track Vdd to optimize system performance and power. In other implementations, first device 110 is another type of device and/or second device 130 is another type of device. In one implementation, voltage regulation module 120 is programmable, allowing the dynamic range of second voltage rail 125 to be set based on the desired operating range of second device 130. In various implementations, voltage regulation module 120 includes one or more comparators, control logic, and power stage circuitry. In one implementation, the power stage circuitry uses a switched-capacitor boost. In another implementation, the power state circuitry uses integrated inductors. In other implementations, voltage regulation module 120 can use other types of voltage boosting and/or conversion techniques.

Figure 2:
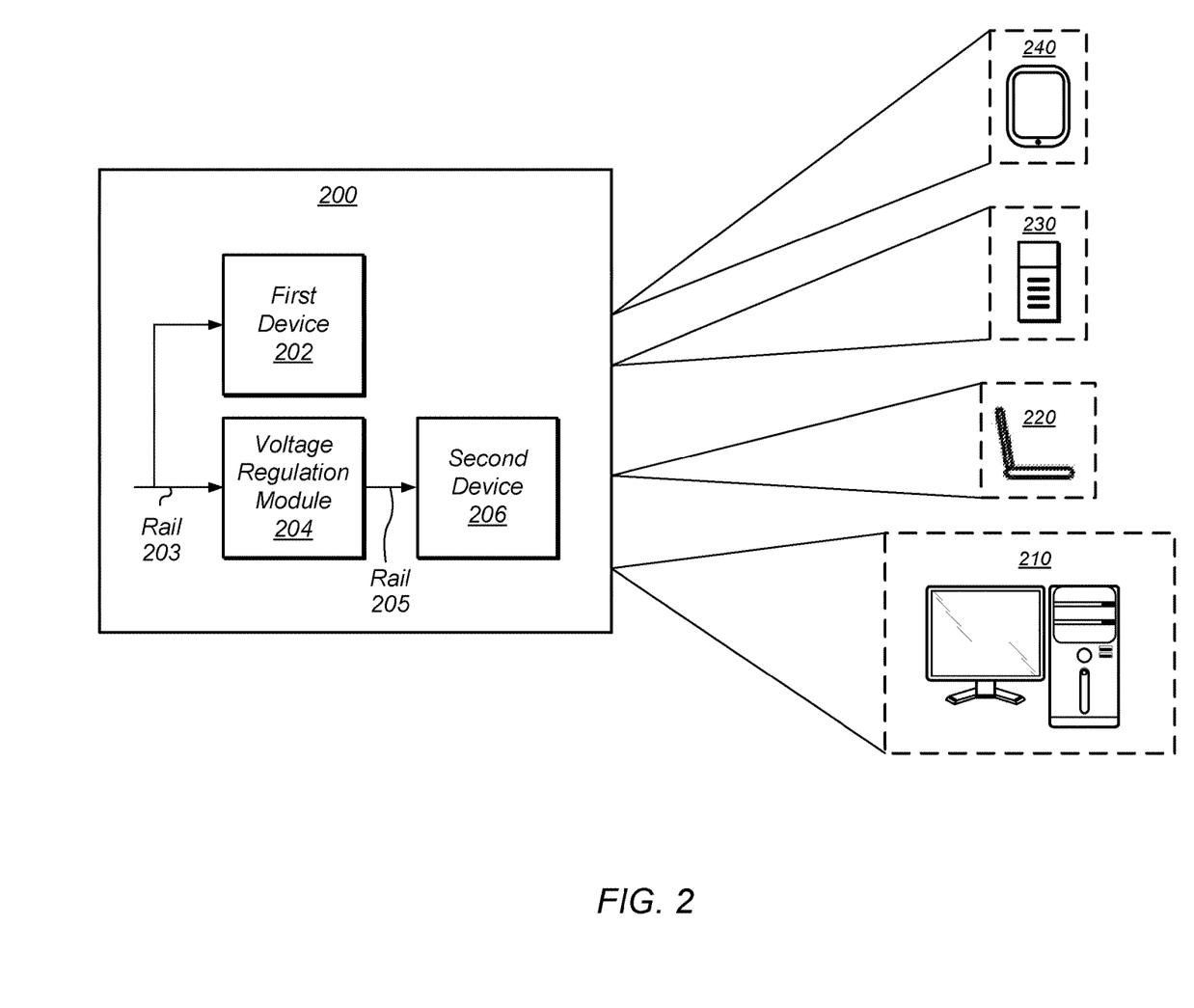
FIG. 2 is a block diagram of one implementation of a computing system.

Turning now to FIG. 2, a block diagram of one implementation of a computing system 200 is shown. As shown, system 200 represents chip, circuitry, components, etc., of a desktop computer 210, laptop computer 220, server 230, mobile device 240, or otherwise. Other devices are possible and are contemplated. In the illustrated implementation, the system 200 includes at least first device 202 powered by voltage rail 203, voltage regulation module 204, and second device 206 powered by voltage rail 205. In one implementation, first device 202 is a processing unit and second device 206 is a memory device (e.g., static random-access memory (SRAM) device). It is noted that system 200 can include any number of other components which are not shown to avoid obscuring the figure. In one implementation, voltage regulation module 204 generates voltage rail 205 from voltage rail 203, with voltage rail 205 having a voltage which meets desired set points and has a desired dynamic range for second device 206. More details regarding the operation of voltage regulation module 204 will be provided throughout the remainder of this disclosure.

Figure 3:
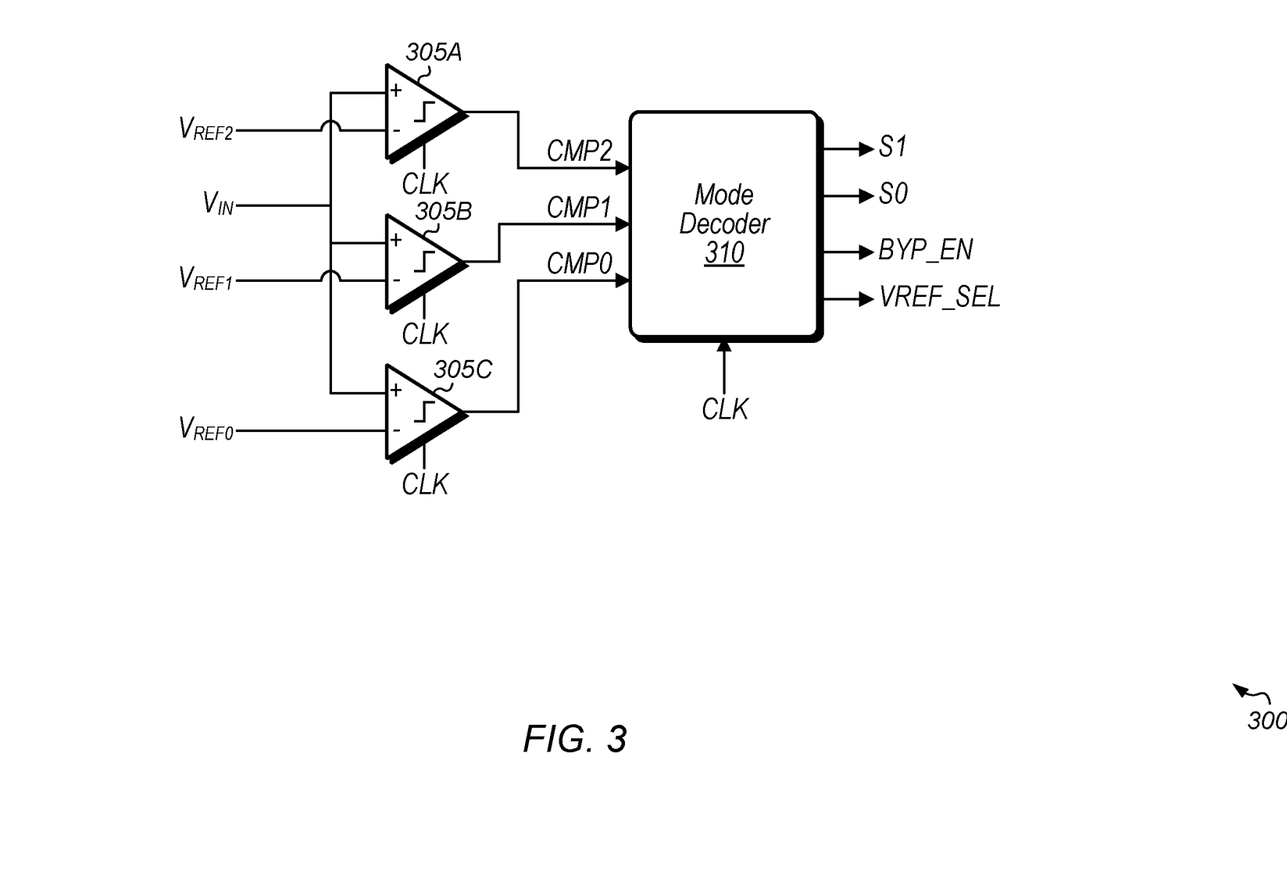
FIG. 3 is a block diagram of one implementation of a portion of the circuitry for implementing a voltage regulation module.

Referring now to FIG. 3, a block diagram of one implementation of a portion of the circuitry for implementing a voltage regulation module 300 is shown. In one implementation, comparators 305A-C receive the input voltage, one or more reference voltages, and a clock. It is noted that the terms "input voltage", "Vdd", and "logic voltage" can be used interchangeably herein. Also, it is noted that "reference voltages" can also be referred to herein as "voltage thresholds". As shown in FIG. 3, there are three comparators 305A-C which receive three separate reference voltages. The outputs of comparators 305A-C are provided to mode decoder 310. It should be understood that having three comparators 305A-C is indicative of one particular implementation. In other implementations, other numbers of comparators 305A-C can receive other numbers of reference voltages.

In one implementation, mode decoder 310 generates mode control signals S0 and S1, a bypass enable signal BYP_EN, and a voltage reference select signal VREF_SEL. In one implementation, the mode control signals S0 and S1 are provided to mode to MUX decoder blocks in a plurality of phase interleaving channel units. In one implementation, the bypass enable signal controls a bypass switch which determines whether the input voltage $V_{IN}$ is connected directly to an output voltage ($V_O$). In one implementation, the voltage reference select signal VREF_SEL determines which voltage threshold is coupled to regulation comparators for determining the target regulated $V_O$ voltage.

Figure 4:
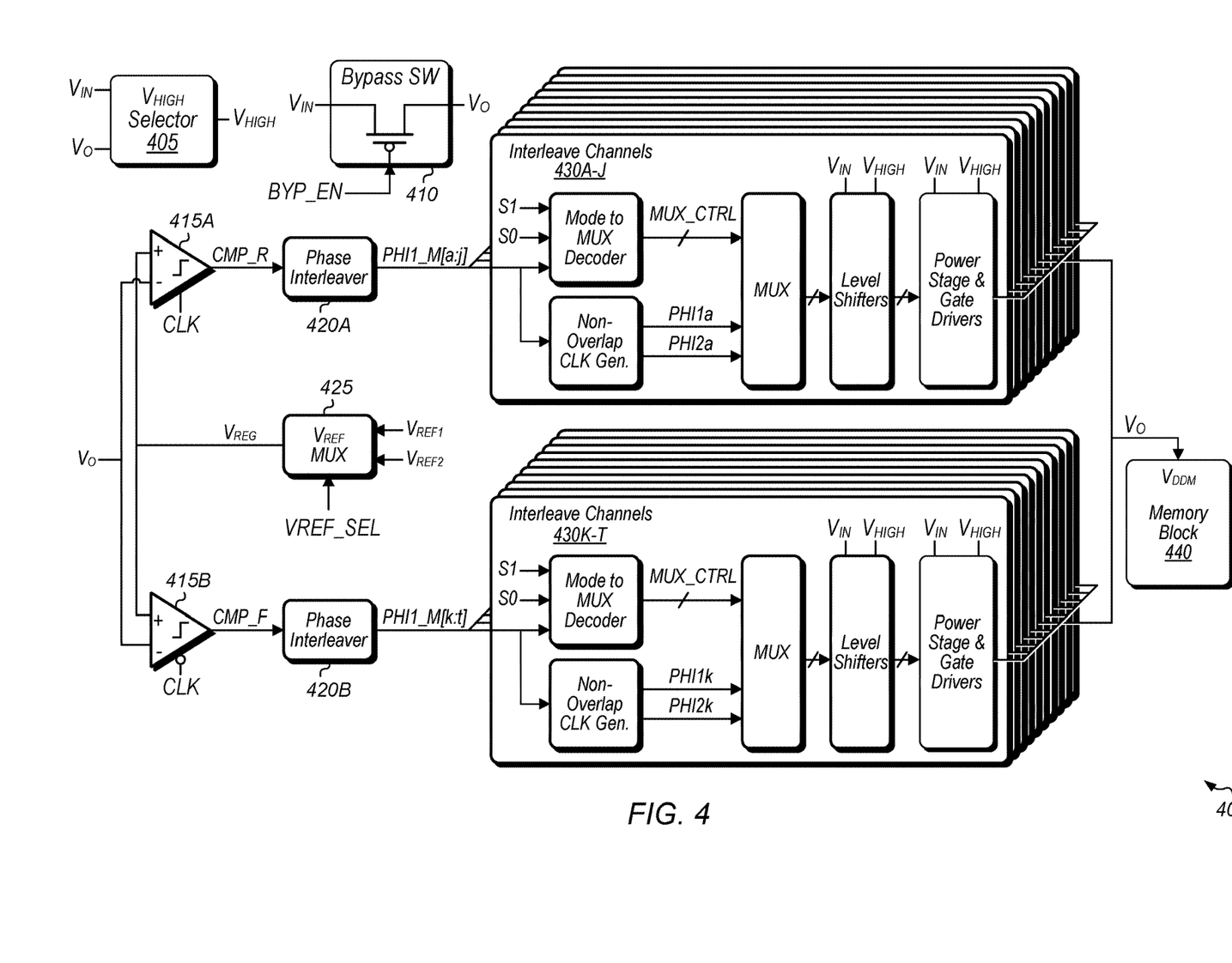
FIG. 4 is a block diagram of one implementation of a voltage regulation module circuit within a computing system.
Figure 8:
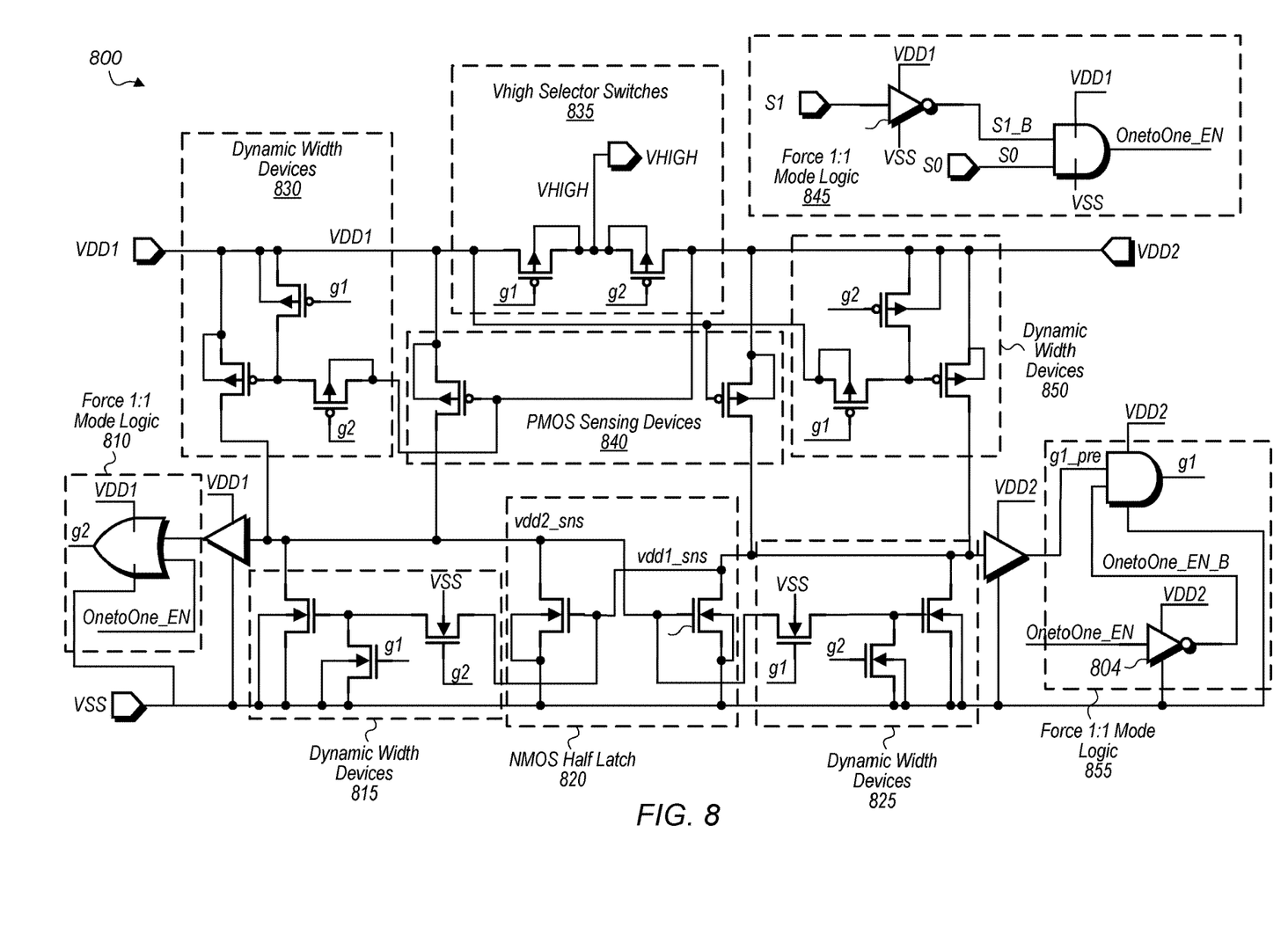
FIG. 8 is a diagram of one implementation of a high voltage ($V_{HIGH}$) selector circuit for determining which of two supply voltage rails has a higher voltage.

Turning now to FIG. 4, a block diagram of one implementation of a voltage regulation module circuit 400 within a computing system is shown. It is noted that in one implementation, mode decoder 310 (of FIG. 3) generates the S0, S1, VREF_SEL, and BYP_EN control signals that are coupled to various units within voltage regulation module circuit 400. In one implementation, the input voltage $V_{IN}$ and the output voltage $V_O$ are provided to $V_{HIGH}$ selector 405, with $V_{HIGH}$ selector 405 determining which voltage is higher and providing this voltage $V_{HIGH}$ to other units within voltage regulation module circuit 400. In one implementation, the $V_{HIGH}$ signal is coupled to level shifters, gate drivers, and power stages within interleave channel modules 425A-T. One example of an implementation of a $V_{HIGH}$ selector 405 is shown in FIG. 8. In one implementation, bypass switch 410 receives the input voltage $V_{IN}$ and connects the input voltage $V_{IN}$ to the output voltage $V_O$ or isolates the input voltage $V_{IN}$ from the output voltage $V_O$ depending on the value of the bypass signal BYP_EN.

In one implementation, $V_{REF}$ multiplexer (MUX) 425 receives two voltages ($V_{REF1}$ and $V_{REF2}$) and a select signal VREF_SEL. The output of $V_{REF}$ multiplexer (MUX) 425 is coupled to one of the inputs of comparator 415A and one of the inputs of comparator 415B. The output voltage $V_O$ is also coupled to comparators 415A-B. Comparators 415A-B generate outputs CMP_R and CMP_F which indicate which voltage is higher ($V_{REG}$ or $V_O$). It is noted that comparator 415A is clocked by a non-inverted clock signal and comparator 415B is clocked by an inverted clock signal to keep comparator 415A and 415B out of phase with respect to each other. The output CMP_R of comparator 415A is coupled to phase interleaver 420A and the output CMP_R of comparator 415B is coupled to phase interleaver 420B. The output of phase interleaver 420A is coupled to interleave channel modules 430A-J and the output of phase interleaver 420B is coupled to interleave channel modules 430K-T. Phase interleavers 420A-B generate clock signals which are out of phase with respect to each other and send these clock signals to the different interleave channel modules 430A-T.

As shown, each interleave channel module 430A-J includes a mode to mux decoder, a non-overlap clock generator, a mux which receives $V_{IN}$ and $V_{HIGH}$, MUX_CTRL signals, and PHI1x and PHI2x signals, level shifters, and power stage and gate drivers which receive $V_{IN}$ and $V_{HIGH}$ and the outputs from the level shifters. Similarly, each interleave channel module 430K-T includes a mode to mux decoder, a non-overlap clock generator, a mux, level shifters, and power stage and gate drivers. The mode to mux decoder receives the two mode signals S0 and S1 generated by mode decoder 310. The mode to mux decoder determines which control signals are routed to the power stage and gate drivers to achieve the desired $V_{IN}$ to V conversion ratio based on the values of the mode signals S0 and S1 generated by mode decoder 310. The outputs of interleave channel modules 430A-T provide the supply voltage $V_{DDM}$ to memory block 440.

It is noted that the arrangement of circuitry and control signals generated by the control logic in circuit 400 allows for the memory bitcell supply voltage $V_{DDM}$ to memory block 440 to be above, below, or the same as the input voltage $V_{IN}$. Rather than requiring a separate supply voltage rail, circuit 400 allows the memory bitcell supply voltage $V_{DDM}$ to be generated from the logic voltage $V_{IN}$.

Figure 5:
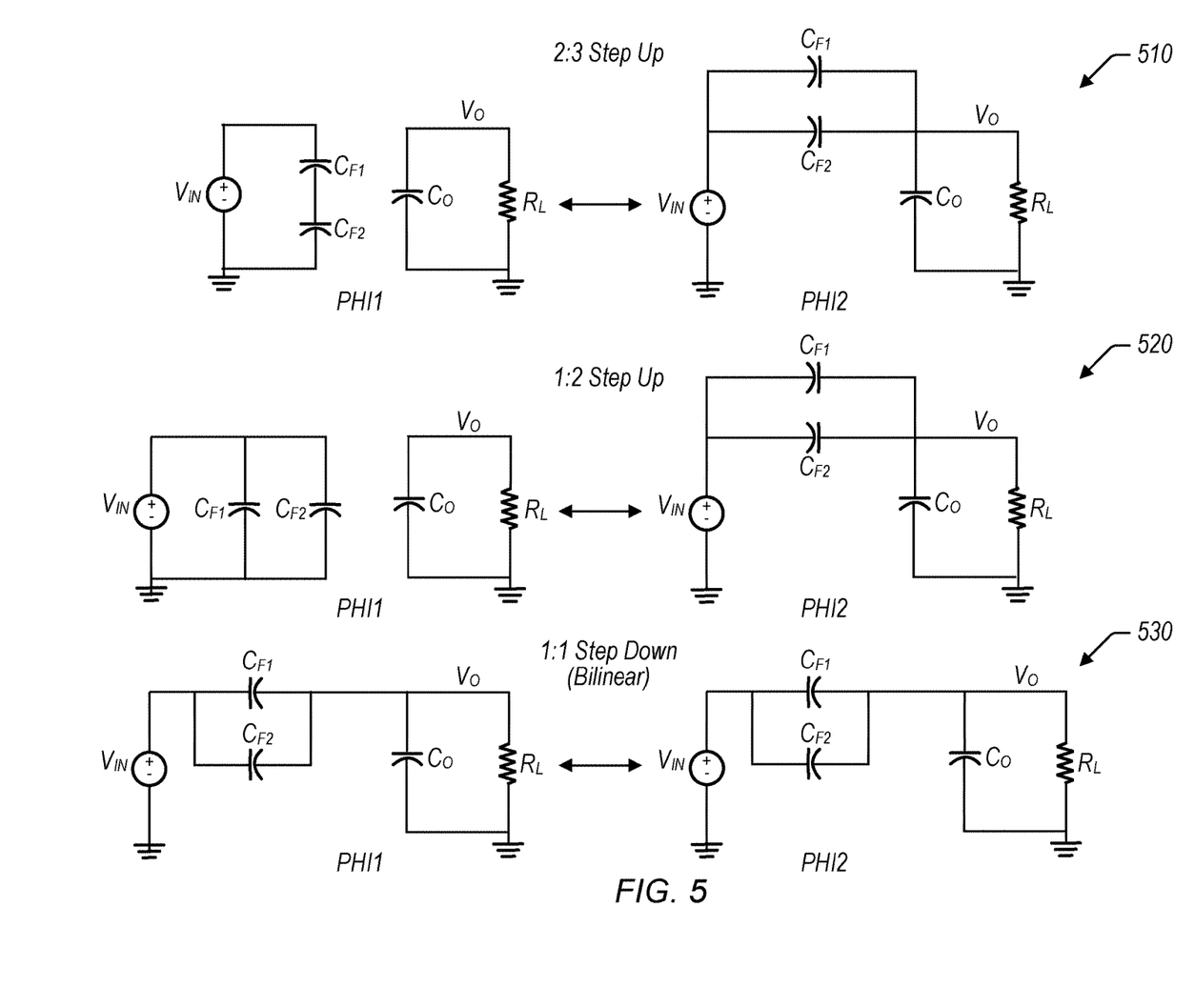
FIG. 5 illustrates diagrams of power stage circuitry used in a voltage regulation module in accordance with one implementation.

Referring now to FIG. 5, diagrams of power stage circuitry used in a voltage regulation module in accordance with one implementation are shown. Circuit 510 is one example of a circuit with capacitors $C_{F1}$ and $C_{F2}$ for implementing a 2:3 step up conversion of voltage from the input voltage $V_{IN}$ to the output voltage $V_{OUT}$ across capacitor $C_O$ and delivered to the load (represented by $R_L$). Circuit 520 is one example of a circuit for implementing a 1:2 step up conversion of voltage from the input voltage $V_{IN}$ to the output voltage $V_{OUT}$. Circuit 530 is one example of a circuit for implementing a 1:1 step down conversion of voltage from the input voltage $V_{IN}$ to the output voltage $V_{OUT}$. The left-side of circuits 510, 520, and 530 shows the circuit during a charge phase and the right-side shows the circuit during a discharge phase after switches (not shown) have been flipped. In one implementation, these circuits 510, 520, and 530 are used within the power stage and gate drivers of each interleave channel module 430A-T (of FIG. 4). It should be understood that in other implementations, other circuits can be used within the power stage and gate drivers of each interleaving channel module to achieve other step-up or step-down conversion ratios.

Figure 6:
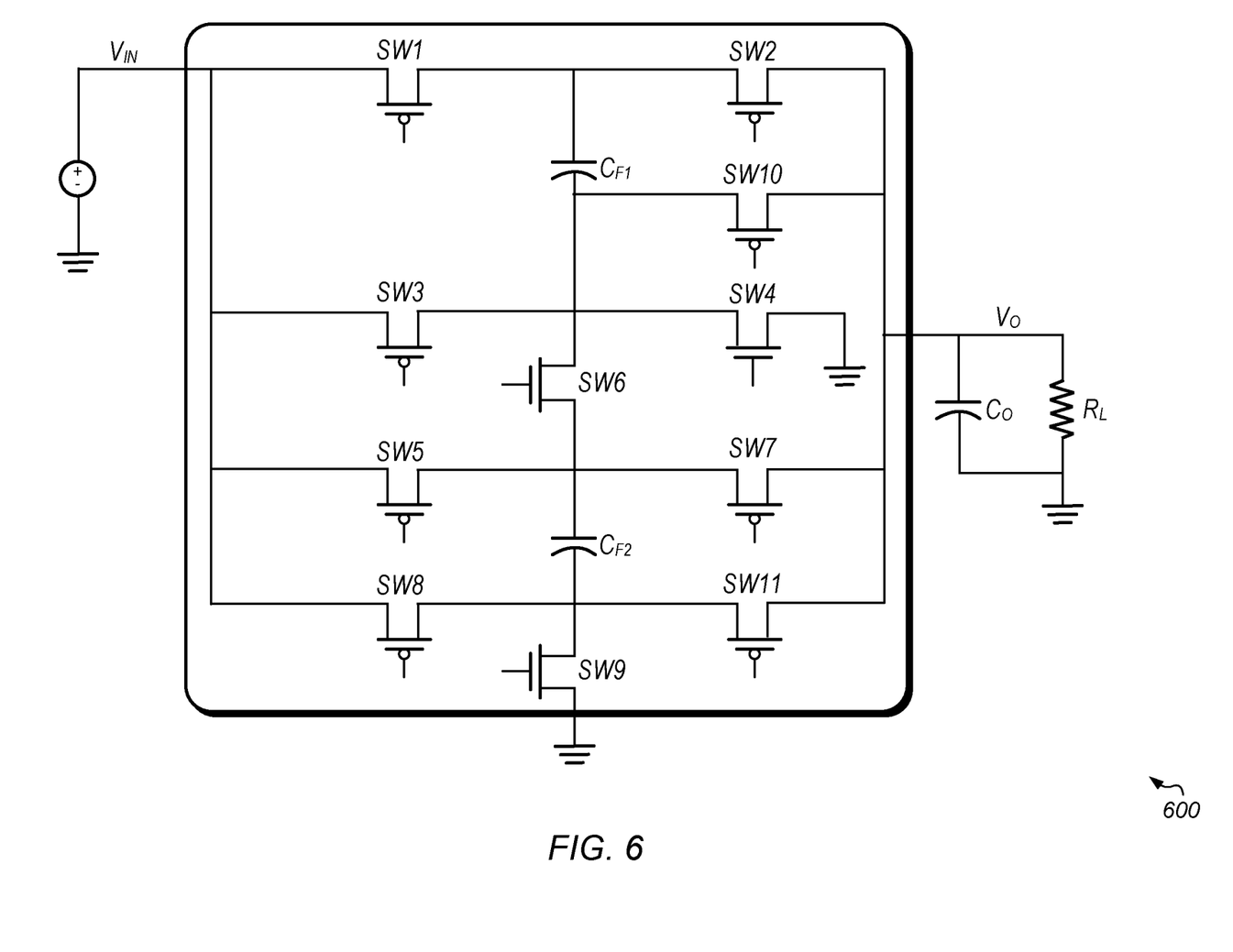
FIG. 6 is a diagram of one implementation of a power stage circuit.

Turning now to FIG. 6, a diagram of one implementation of a power stage circuit 600 is shown. In one implementation, circuit 600 is located within a voltage regulation module circuit (e.g., circuit 400 of FIG. 4) for converting a logic voltage to a memory bitcell voltage, with a memory bitcell represented by load resistor $R_L$. For example, in one implementation, circuit 600 is located within each interleave channel module 430A-T (of FIG. 4). In one implementation, voltage regulation phase interleaving techniques are performed using circuit 600. For example, circuit 600 implements phase interleaving techniques to minimize the required capacitor $C_O$ and $V_{OUT}$ ripple. In one implementation, circuit 600 includes two flying capacitors $C_{F1}$ and $C_{F2}$ and 11 power switches SW1-11. By taking different charge or discharge paths, multiple different gain ratios can be achieved by circuit 600. It should be understood that circuit 600 is merely one example of a power stage circuit that can be used in one implementation. In other implementations, other types of power stage circuits (e.g., integrated inductors) can be used within a voltage regulation module circuit.

Figure 7:
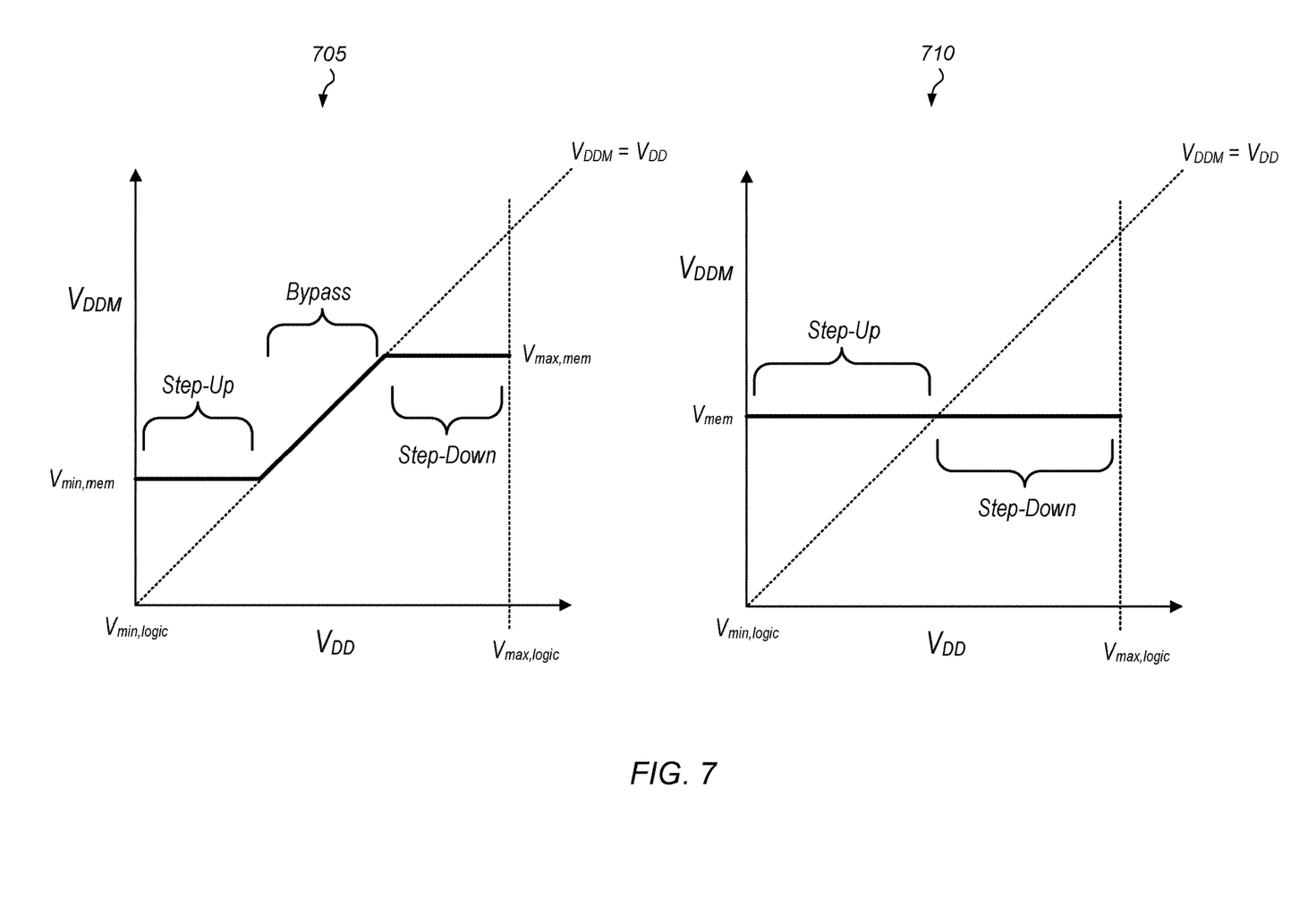
FIG. 7 illustrates graphs of different implementations of a memory voltage ($V_{DDM}$) plotted versus logic voltage ($V_{DD}$).

Referring now to FIG. 7, graphs 705 and 710 of different implementations of a memory voltage ($V_{DDM}$) plotted versus logic voltage ($V_{DD}$) are shown. It should be understood that graphs 705 and 710 illustrate two examples of memory voltage versus logic voltage that can be programmed in a voltage regulation module circuit 400 (e.g., voltage regulation module circuit 400). In other implementations, other set points and conversion ratios for generating a memory voltage from a logic voltage can be programmed into the voltage regulation module circuit to achieve other desired conversion patterns. In one implementation, the memory voltage is programmed as shown in graph 705 using a step-up mode, bypass mode, and step-down mode for the illustrated portions of the logic voltage. In another implementation, the memory voltage is programmed to follow the pattern shown in graph 710 with only a step-up mode or a step-down mode being used. In other implementations, the memory voltage is programmed to follow other patterns with other arrangements of step-up mode, bypass mode, and/or step-down mode.

Turning now to FIG. 8, a diagram of one implementation of a high voltage ($V_{HIGH}$) selector circuit 800 for determining which of two supply voltage rails has a higher voltage is shown. In one implementation, VDD1 is an input voltage received by a voltage regulation module circuit (e.g., circuit 400 of FIG. 4) and VDD2 is an output voltage generated by the voltage regulation module circuit. In one implementation, the input voltage VDD1 is a logic voltage rail which supplies a processor and/or one or more other components of a system on chip (SoC). In one implementation, the output voltage VDD2 is a memory bitcell voltage rail which supplies one or more memory bitcell arrays. In one implementation, $V_{HIGH}$ selector circuit 800 includes dynamic width devices 815, 825, 830, and 850 to implement dynamic transistor width resizing.

In one implementation, PMOS sensing devices 840 are used to sense the VDD1 and VDD2 voltages. The outputs of these sensing devices 840 are coupled to an NMOS half latch 820, and the output of NMOS half latch 820 is then coupled to support logic to control the $V_{HIGH}$ selector switches 835. The $V_{HIGH}$ selector switches 835 pass through whichever voltage is higher between VDD1 and VDD2 to the $V_{HIGH}$ output. In one implementation, the $V_{HIGH}$ output is coupled to level shifters, gate drivers, and power stages in the phase interleaving circuits (e.g., modules 430A-T of FIG. 4).

In one implementation, force 1:1 mode logic 845 receives mode select signals S0 and S1 which are generated by a mode decoder (e.g., mode decoder 310 of FIG. 3). Logic 845 generates the signal OnetoOne_EN which is high when 1:1 step down mode is entered. In one implementation, circuit 800 includes force 1:1 mode logic 810 that overrides the current state of the g1 and g2 control signals, forcing g1 low and g2 high. This in turn forces $V_{HIGH}$ to be connected to $V_{IN}$ whenever 1:1 mode is entered.

In one implementation, the architecture of circuit 800 implements dynamic transistor width resizing for positive metal-oxide semiconductor (PMOS) sensing and negative metal-oxide semiconductor (NMOS) latch devices. Accordingly, the widths of the device pair used for sensing the next $V_{HIGH}$ switch transition state are substantially increased. This helps to reduce the $V_{IN}$ to $V_{OUT}$ delta needed to induce a $V_{HIGH}$ switch transition. After a new $V_{HIGH}$ transition, device widths are returned to the normal size and the other set of devices needed for the next $V_{HIGH}$ transition have their widths increased.

It should be understood that circuit 800 is one example of an arrangement of transistors and other logic for one particular implementation of a high voltage selector circuit. It should be understood that in other implementations, circuit 800 can include other transistors and/or components, omit one or more of the illustrated transistors and/or components, and/or be arranged in other suitable fashions.

Figure 9:
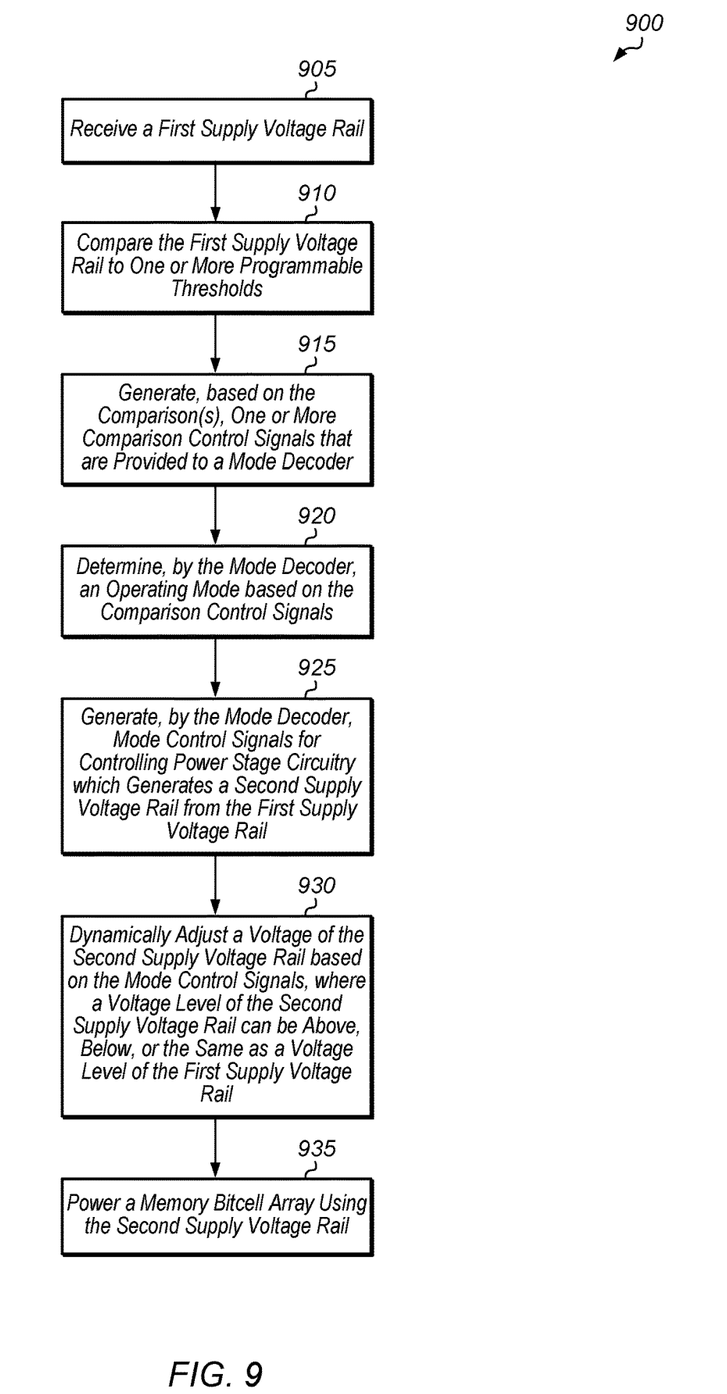
FIG. 9 is a generalized flow diagram illustrating one implementation of a method for dynamically adjusting an output voltage rail generated from an input voltage rail based on one or more programmable thresholds.
Figure 10:
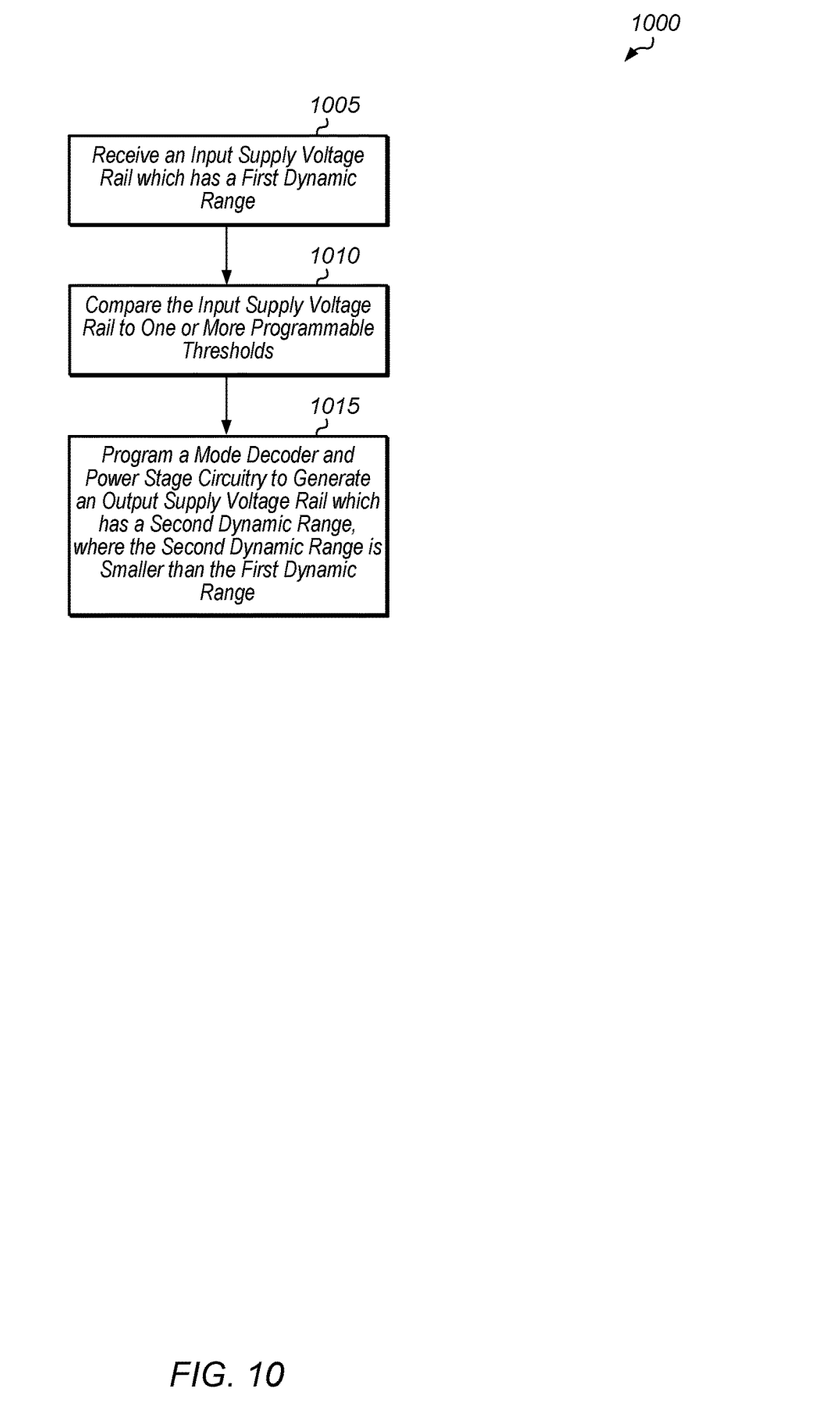
FIG. 10 is a generalized flow diagram illustrating one implementation of a method for generating an output supply voltage rail with a smaller dynamic range than an input supply voltage rail.
Figure 11:
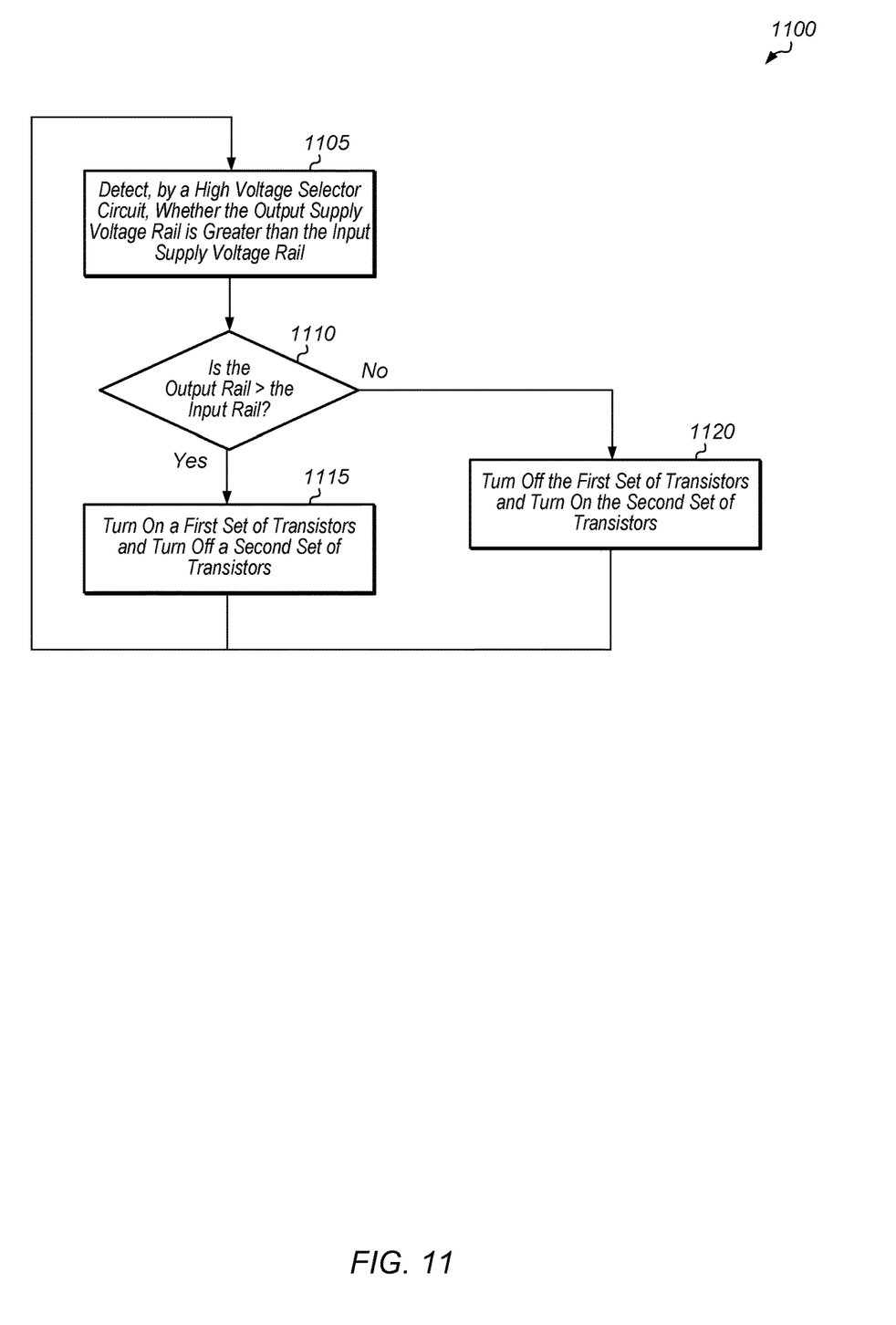
FIG. 11 is a generalized flow diagram illustrating one implementation of a method for dynamically adjusting transistor width in a voltage regulation circuit.

Referring now to FIG. 9, one implementation of a method 900 for dynamically adjusting an output voltage rail generated from an input voltage rail based on one or more programmable thresholds is shown. For purposes of discussion, the steps in this implementation and those of FIG. 10-11 are shown in sequential order. However, it is noted that in various implementations of the described methods, one or more of the elements described are performed concurrently, in a different order than shown, or are omitted entirely. Other additional elements are also performed as desired. Any of the various systems or apparatuses described herein are configured to implement method 900.

In one implementation, a voltage regulation module circuit receives a first supply voltage rail (block 905). In one implementation, the first supply voltage rail is a logic voltage which supplies one or more processors. In one implementation, the first supply voltage rail varies according to a mode of the processor(s) and/or other operating conditions. The circuit compares the first supply voltage rail to one or more programmable thresholds (block 910). Based on the comparison of the first voltage to the one or more programmable thresholds, the circuit generates one or more comparison control signals that are provided to a mode decoder (block 915). Next, the mode decoder determines a mode for operating the circuit based on the comparison control signals (block 920). Then, the mode decoder generates mode control signals for controlling power stage circuitry for generating a second supply voltage rail from the first supply voltage rail (block 925). In one implementation, the power stage circuitry uses phase interleaving switched capacitors to generate the second supply voltage rail. In another implementation, the power stage circuitry uses inductors to generate the second supply voltage rail.

Next, the power stage circuitry dynamically adjusts a voltage of the second supply voltage rail based on the mode control signals, where a voltage level of the second supply voltage rail can be above, below, or the same as a voltage level of the first supply voltage rail (block 930). Then, a memory bitcell array is powered using the second supply voltage rail (block 935). After block 935, method 900 ends. It is noted that method 900 allows the circuit to dynamically adjust to changes to the voltage level of the first supply voltage rail and adjust the voltage level of a second supply voltage rail to meet a desired voltage range for the memory bitcell array.

Turning now to FIG. 10, one implementation of a method 1000 for generating an output supply voltage rail with a smaller dynamic range than an input supply voltage rail is shown. A circuit receives an input supply voltage rail which has a first dynamic range (block 1005). The circuit compares the input supply voltage rail to one or more programmable thresholds (block 1010). The circuit uses a programmable mode decoder and power stage circuitry to generate an output supply voltage rail which has a second dynamic range, where the second dynamic range is smaller than the first dynamic range (block 1015). After block 1015, method 1000 ends.

Referring now to FIG. 11, one implementation of a method 1100 for dynamically adjusting transistor width in a voltage regulation module circuit is shown. A high voltage ($V_{HIGH}$) selector circuit detects whether an output supply voltage rail is greater than an input supply voltage rail (block 1105). If the output supply voltage rail is greater than the input supply voltage rail (conditional block 1110, "yes" leg), then a voltage regulation module circuit turns on a first set of transistors and turns off a second set of transistors (block 1115). Otherwise, if output supply voltage rail is less than or equal to the input supply voltage rail (conditional block 1110, "no" leg), then the circuit turns off the first set of transistors and turns on the second set of transistors (block 1120). After blocks 1115 and 1120, method 1100 returns to block 1105 to continue monitoring the relationship between the output supply voltage rail and the input supply voltage rail.

Figure 12:
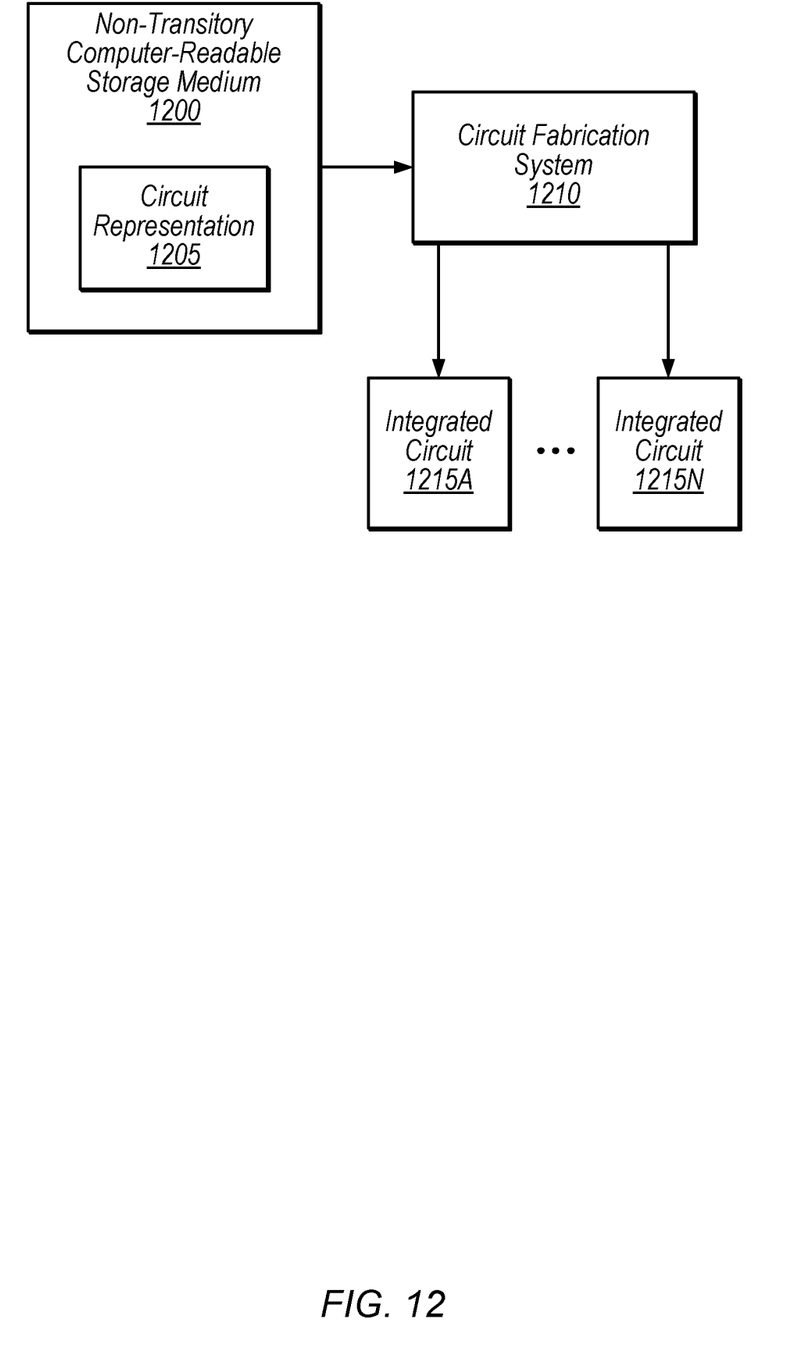
FIG. 12 is a block diagram illustrating one implementation of a non-transitory computer-readable storage medium that stores a circuit representation.

Turning now to FIG. 12, a block diagram illustrating one implementation of a non-transitory computer-readable storage medium 1200 that stores a circuit representation 1205 is shown. In one implementation, circuit fabrication system 1210 processes the circuit representation 1205 stored on non-transitory computer-readable storage medium 1200 and fabricates any number of integrated circuits 1215A-N based on the circuit representation 1205.

Non-transitory computer-readable storage medium 1200 can include any of various appropriate types of memory devices or storage devices. Medium 1200 can be an installation medium (e.g., a thumb drive, CD-ROM), a computer system memory or random access memory (e.g., DRAM, DDR RAM, SRAM, EDO RAM, Rambus RAM), a non-volatile memory (e.g., a Flash, magnetic media, a hard drive, optical storage), registers, or other types of memory elements. Medium 1200 can include other types of non-transitory memory as well or any combinations thereof. Medium 1200 can include two or more memory mediums which reside in different locations (e.g., in different computer systems that are connected over a network).

In various implementations, circuit representation 1205 is specified using any of various appropriate computer languages, including hardware description languages such as, without limitation: VHDL, Verilog, SystemC, SystemVerilog, RHDL, etc. Circuit representation 1205 is usable by circuit fabrication system 1210 to fabricate at least a portion of one or more of integrated circuits 1215A-N. The format of circuit representation 1205 is recognizable by at least one circuit fabrication system 1210. In some implementations, circuit representation 1205 includes one or more cell libraries which specify the synthesis and/or layout of the integrated circuits 1215A-N.

Circuit fabrication system 1210 includes any of various appropriate elements configured to fabricate integrated circuits. This can include, for example, elements for depositing semiconductor materials (e.g., on a wafer, which can include masking), removing materials, altering the shape of deposited materials, modifying materials (e.g., by doping materials or modifying dielectric constants using ultraviolet processing), etc. Circuit fabrication system 1210 can also perform testing of fabricated circuits for correct operation.

In various implementations, integrated circuits 1215A-N operate according to a circuit design specified by circuit representation 1205, which can include performing any of the functionality described herein. For example, integrated circuits 1215A-N can include any of various elements shown in the circuits illustrated herein and/or multiple instances of these circuits. Furthermore, integrated circuits 1215A-N can perform various functions described herein in conjunction with other components. For example, integrated circuits 1215A-N can be coupled to supply voltage circuitry that is configured to provide a supply voltage (e.g., as opposed to including a supply voltage itself). Further, the functionality described herein can be performed by multiple connected integrated circuits.

As used herein, a phrase of the form "circuit representation that specifies a design of a circuit . . . " does not imply that the circuit in question must be fabricated in order for the element to be met. Rather, this phrase indicates that the circuit representation describes a circuit that, upon being fabricated, will be configured to perform the indicated actions or will include the specified components.

In various implementations, program instructions are used to implement the methods and/or mechanisms described herein. For example, program instructions are written that describe the behavior or design of hardware. In one implementation, such program instructions are represented by a hardware design language (HDL) such as Verilog. In various implementations, the program instructions are stored on any of a variety of non-transitory computer readable storage mediums. The storage medium is accessible by a computing system during use to provide the program instructions to the computing system for circuit fabrication, program execution, or otherwise. Generally speaking, such a computing system includes at least one or more memories and one or more processors configured to execute program instructions.

It should be emphasized that the above-described implementations are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A circuit comprising:
   a comparator configured to compare a received first supply voltage to one or more thresholds;
   a mode decoder configured to determine an operating mode based on one or more signals generated by the comparator and generate a plurality of mode control signals, the plurality of mode control signals including at least a first mode control signal to cause a second supply voltage to be generated based on the first supply voltage; and
   circuitry configured to dynamically adjust a voltage of the second supply voltage based on the operating mode.

2. The circuit as recited in claim 1, wherein the first supply voltage varies according to an operating mode of a device.

3. The circuit as recited in claim 1, further comprising a mode decoder configured to generate the mode control signal based on the signals generated by the comparator.

4. The circuit as recited in claim 3, wherein the mode control signals comprise one or more mode indicators.

5. The circuit as recited in claim 3, wherein the plurality of mode control signals further comprise at least one of a second mode control signal different from the first mode control signal, a bypass enable signal, and a voltage reference select signal.

6. The circuit as recited in claim 1, wherein the first supply voltage is for a processor and the second supply voltage is for a memory.

7. The circuit as recited in claim 1, wherein the first supply voltage has a first dynamic range, and the second supply voltage has a second dynamic range that is smaller than the first dynamic range.

8. A method comprising:
   comparing a received first supply voltage to one or more thresholds;
   determining an operating mode based on the comparing;
   generating a first mode control signal, of a plurality of mode control signals, to cause a second supply voltage to be generated based on the first supply voltage; and
   dynamically adjusting a voltage of the second supply voltage based on the operating mode.

9. The method as recited in claim 8, wherein the first supply voltage varies according to an operating mode of a device.

10. The method as recited in claim 8, further comprising:
    generating one or more comparison control signals; and
    generating, by a mode decoder, the mode control signal based on the comparison control signals.

11. The method as recited in claim 10, wherein the mode control signals comprise one or more mode indicators.

12. The method as recited in claim 10, wherein the plurality of mode control signals further include at least one of a second mode control signal different from the first mode control signal, a bypass enable signal, and a voltage reference select signal.

13. The method as recited in claim 8, wherein the first supply voltage is for a processor and the second supply voltage is for a memory.

14. The method as recited in claim 8, wherein the first supply voltage has a first dynamic range, and the second supply voltage has a second dynamic range that is smaller than the first dynamic range.

15. An apparatus comprising:
    a voltage regulation module configured to receive a first voltage;
    a first device configured to receive the first voltage; and
    a second device configured to receive a second voltage from the voltage regulation module;
    wherein the voltage regulation module is configured to:
      compare the received first supply to one or more thresholds;
      determine an operating mode based on one or more signals generated in response to said compare; and
      dynamically adjust a voltage of the second supply voltage based on the operating mode.

16. The apparatus as recited in claim 15, wherein the first supply voltage varies according to an operating mode of the first device.

17. The apparatus as recited in claim 15, wherein the mode decoder is configured to generate a mode control signal based on the signals generated in response to said compare.

18. The circuit as recited in claim 17, wherein the mode decoder is configured to generate a plurality of mode control signals, wherein the mode control signals comprise one or more mode indicators.

19. The circuit as recited in claim 17, wherein the mode decoder is configured to generate one or more signals including at least one of a first mode control signal, a second mode control signal different from the first mode control signal, a bypass enable signal, and a voltage reference select signal.

20. The circuit as recited in claim 1, wherein the first device is a processor and the second device is a memory.

* * * * *